United States Patent [19]

Guracar

[11] Patent Number: 5,609,155
[45] Date of Patent: Mar. 11, 1997

[54] ENERGY WEIGHTED PARAMETER SPATIAL/TEMPORAL FILTER

[75] Inventor: Ismayil M. Guracar, Redwood City, Calif.

[73] Assignee: Acuson Corporation, Mountain View, Calif.

[21] Appl. No.: 429,056

[22] Filed: Apr. 26, 1995

[51] Int. Cl.$^6$ ........................................................ A61B 8/06
[52] U.S. Cl. ................................... 128/661.09; 73/861.25
[58] Field of Search .......................... 128/661.07–661.1; 73/861.25; 382/6

[56] References Cited

U.S. PATENT DOCUMENTS

| | | | |
|---|---|---|---|
| 4,928,698 | 5/1990 | Bonnefous | 128/661.09 |
| 5,014,710 | 5/1991 | Maslak et al. | 128/660.05 |
| 5,099,848 | 5/1992 | Parker et al. | 128/661.07 |
| 5,165,413 | 11/1992 | Maslak et al. | 128/660.05 |
| 5,285,788 | 2/1994 | Arenson et al. | 128/660.05 |
| 5,357,965 | 10/1994 | Hall et al. | 128/661.08 |
| 5,363,849 | 11/1994 | Suorsa et al. | 128/661.08 |
| 5,429,137 | 7/1995 | Phelps et al. | 128/661.09 |
| 5,487,389 | 1/1996 | Banjanin et al. | 128/661.09 |
| 5,494,037 | 2/1996 | Banjanin et al. | 128/661.09 |

OTHER PUBLICATIONS

"Real–time Two–dimensional Blood Flow Imaging Using an Autocorrelation Technique," by Chihiro Kasai et al., IEEE Transactions on Sonics and Ultrasonics, vol. SU–32, No. 3, pp. 458–464, May 1985.

"Real–time Colour Flow Mapping Systems," by D. H. Evans et al., Doppler Ultrasound – Physics, Instrumention, and Clinical Applications, John Wiley & Sons, New York, pp. 102–105, 1989.

"Time Domain Formulation of Pulse Doppler Ultrasound and Blood Velocity Estimation by Cross–Correction," by Bonnefous et al., *Ultrasonic Imaging*, 8, 73–85 (1986).

"Simulation of Real–time Frequency Estimations for Pulsed Doppler Systems," by van Leeuwen et al., Ultrasonic Imaging 8, 252–271, 1986.

*Primary Examiner*—Francis Jaworski
*Attorney, Agent, or Firm*—Majestic, Parsons, Siebert & Hsue

[57] ABSTRACT

In an ultrasound imaging system, the mean velocity of a fluid flow, variance of velocity of the fluid flow and energy value of Doppler ultrasound signals from the flow in response to transmitted ultrasound are first estimated from autocorrelation values of the signals to form a set of parameters for a corresponding sampling time or a corresponding sampling location. An averaging process is then performed on two sets of the estimated parameters corresponding to a plurality of different sampling times in temporal filtering or on two sets of the estimated parameters corresponding to a plurality of different locations in spatial filtering. The filtered parameters are then compared to thresholds in a discrimination process to reject noise and clutter.

43 Claims, 4 Drawing Sheets

ENERGY WEIGHTED PARAMETER SPATIAL/TEMPORAL FILTER

BACKGROUND OF THE INVENTION

This invention relates in general to filters useful in imaging systems such as ultrasound imaging and display systems for displaying such images, and more particularly to a system for filtering and displaying ultrasound Doppler imaging information on moving objects, such as blood flow or moving tissue.

Brightness mode or B-mode imaging is one of the most common type of ultrasound imaging. A B-scan is a view of a cross-sectional slice through an object. A narrow pencil beam of ultrasound is swept through a region of interest to define the scan plane. The beam is formed from bursts of ultrasound and a repetition rate of ultrasound pulse generation is selected. As the pulse propagates into the body along any scan line, echoes are generated which travel back to the receiver. These echoes vary in intensity according to the type of tissue or body structure causing the echoes. This data is presented on a display in which the brightness depends on the echo strength. The B-mode image is typically presented in a grey-scale of black and white. Frequently, B-mode imaging is used to display stationary and moving tissues in the human or animal body.

In addition to B-mode, ultrasound imaging may also offer two-dimensional Doppler flow detection, also known as color Doppler imaging on moving objects in the body, such as blood. As disclosed, for example, in U.S. Pat. Nos. 5,014,710; 5,165,413; and 5,285,788 assigned to Acuson Corporation of Mountain View, Calif., in addition to the ultrasound beam for B-mode imaging, a separate acoustic Doppler beam is steered at preselected angles and is optimized for Doppler data acquisition of moving objects such as blood. Information such as velocity, variance of velocity, and energy of the moving object may be acquired by analyzing the Doppler shift of ultrasound frequencies detected by the receivers from multiple sample volumes along the direction of each Doppler beam. The Doppler information acquired along multiple scan lines is displayed as a color-encoded image that is spatially coordinated with, superimposed upon, and simultaneously displayed with, the B-mode grey-scale image to facilitate clinical diagnosis, for example. The three patents referred to above are incorporated herein by reference in their entirety.

As described in U.S. Pat. No. 5,014,710 to Maslak et al., the Doppler information signals are passed through a high pass filter which eliminates the static B-mode information. The mean velocity for each sample is determined in a velocity estimator and then stored in a frame memory. The velocity estimator will typically include fast Fourier transform or autocorrelation circuitry and, typically, will compute other blood flow parameters including variance and power. The above-described system of Maslak et al. has been adopted in, for example, the Acuson 128 color Doppler subsystem.

When used for imaging blood flow, Doppler signals are derived from ultrasonic echoes from red blood cells and other moving objects in the blood vessels in a scan imaging format. These echoes are mixed with background noise which degrades the image. To improve the signal-to-noise ratio (SNR), it may be desirable to employ temporal persistence in the Doppler imaging system, where data is filtered in the temporal dimension to improve the signal-to-noise ratio, thereby trading temporal resolution for more "accurate" flow presentation. In other words, two or more consecutive frames of Doppler data may be filtered by computing an average value of these frames and the average value is displayed instead of the individual consecutive frames.

In one approach, the above temporal filtering is performed by first calculating the autocorrelation values of the Doppler data of successive frames. Then temporal filtering is performed in autocorrelation space. In order to maintain dynamic range and precision, the autocorrelation values may be maintained to a large number of bits during the temporal filtering operations. Since these operations must be performed at high speed in a real time system, this can be a costly approach. Retaining data with greater precision also requires large data storage which is also costly.

After temporal filtering, the filtered Doppler frames are then sent to a discriminator where the filtered Doppler data are compared to a certain threshold. If the filtered signal amplitude exceeds the threshold, then the signal is scan converted and then displayed. Otherwise, the pixel value corresponding to the signal to be displayed will be set so that no image such as a color image is displayed.

In another approach to temporal filtering, the autocorrelated Doppler data are sent to the discriminator for comparison to the threshold first without filtering and the output data frames from the discriminator are then filtered. While this approach avoids having to store or operate on autocorrelation values of large number of bits, such approach is disadvantageous since significant information may be lost in the discrimination process in the discriminator before temporal averaging, thereby degrading the subsequent temporal averages obtained.

None of the above-described systems is entirely satisfactory. It is therefore desirable to provide an improved temporal filter which avoids the above-described problems.

SUMMARY OF THE INVENTION

This invention is based on the recognition that by first estimating from each of the autocorrelation function signals or other signals containing Doppler information (referred to hereinbelow simply as "Doppler signals") on moving objects parameters related to mean velocity and/or variance of velocity at a corresponding sampling time or location, and then deriving the average of parameters related to mean velocity and/or variance of velocity as functions of energies of the signals, the above-described difficulties of prior art systems are avoided. A discrimination process is then preferably applied to the averaged parameters by taking the average of estimated parameters instead of the autocorrelation functions or other functions. In this manner, it is possible to reduce the high capacity requirements for data storage and high speed computation. Thus, each of the estimated parameters can be accommodated in fewer bits. By performing the averaging or filtering process prior to the discrimination process, valuable information is not lost as compared to other prior art systems. The average velocity and/or average variance of velocity are then preferably set as functions of the average energy.

As shown below, the above described aspects of the invention may be used to perform temporal and/or spatial filtering based not on Doppler shift information but on time shift information in a system such as that described in U.S. Pat. No. 4,928,698 and the article "Time Domain Formulation of Pulse Doppler Ultrasound and Blood Velocity Estimation by Cross-Correlation," by Bonnefous et al., *Ultrasonic Imaging*, 8, 73–85 (1986).

A first aspect of the invention is directed towards an apparatus for filtering a plurality of Doppler or time shift signals, each Doppler or time shift signal containing information on mean velocity of moving velocities, variance of velocity, and on energy of a Doppler or time shift signal. The apparatus comprises an estimator estimating from each of said Doppler or time shift signals parameters related to mean velocity and/or variance of velocity of said Doppler or time shift signal, and a device deriving a weighted average of the parameters related to the mean velocity and/or variance of velocity of the Doppler or time shift signals as functions of the energies of the Doppler or time shift signals. Preferably, this weighted average is derived before any discrimination or other thresholding process has been applied to the mean velocity and/or variance of velocity related parameters of the signals. In the preferred embodiment, the estimator estimates from each of said Doppler or time shift signals a parameter related to energy of said Doppler or time shift signal, and the device derives both a weighted average of the mean velocity parameter and a weighted average variance of velocity parameter; preferably these weighted averages are derived as functions of the average of parameters related to the energies of the Doppler or time shift signals.

Another aspect of the invention is directed towards an apparatus for filtering and displaying a plurality of Doppler or time shift signals of the type described immediately above. The apparatus includes the estimator, and the device described immediately above and in addition a display displaying the averages derived by the device.

Another aspect of the invention is directed towards an apparatus for filtering a plurality of Doppler or time shift signals of the type described above. The apparatus comprises means for estimating from each of said Doppler or time shift signals parameters related to mean velocity and/or variance of velocity of said Doppler or time shift signal, and means for deriving an average of the parameters related to the mean velocity and/or variance of velocity of the Doppler or time shift signals as functions of the energies of the Doppler or time shift signals. Preferably, this weighted average is derived before any discrimination or other thresholding process has been applied to the mean velocity and/or variance of velocity related parameters of the signals. In the preferred embodiment, the estimating means estimates from each of said Doppler or time shift signals parameters related to energy of said Doppler or time shift signal, and the deriving means also derives both a weighted average of the mean velocity parameter and a weighted average variance of velocity parameter; preferably these averages are derived as functions of the average of parameters related to the energies of the Doppler or time shift signals.

Another aspect of the invention is directed towards a method for filtering a plurality of Doppler or time shift signals of the type described above. The method comprises the steps of estimating from each of said Doppler or time shift signals parameters related to mean velocity and/or variance of velocity of said Doppler or time shift signal, and deriving an average of the parameters related to the mean velocity and/or variance of velocity of the Doppler or time shift signals as functions of the energies of the Doppler or time shift signals. Preferably, this weighted average is derived before any discrimination or other thresholding process has been applied to the mean velocity and/or variance of velocity related parameters of the signals. In the preferred embodiment, the estimating step estimates from each of said Doppler or time shift signals parameters related to energy of said Doppler or time shift signal, and the deriving step also derives both a weighted average of the mean velocity parameter and a weighted average variance of velocity parameter; preferably these averages are derived as functions of the average of parameters related to the energies of the Doppler or time shift signals.

Another aspect of the invention is directed towards a method for filtering and displaying a plurality of Doppler or time shift signals of the type described above. This method comprises the estimating and deriving steps immediately described above and in addition the step of displaying the average derived in the deriving step.

BRIEF DESCRIPTION OF THE DRAWINGS

Identical components in the different figures of this application are labelled by the same numerals.

DETAILED DESCRIPTION OF THE PREFERRED EMBODIMENT

Figure 1:
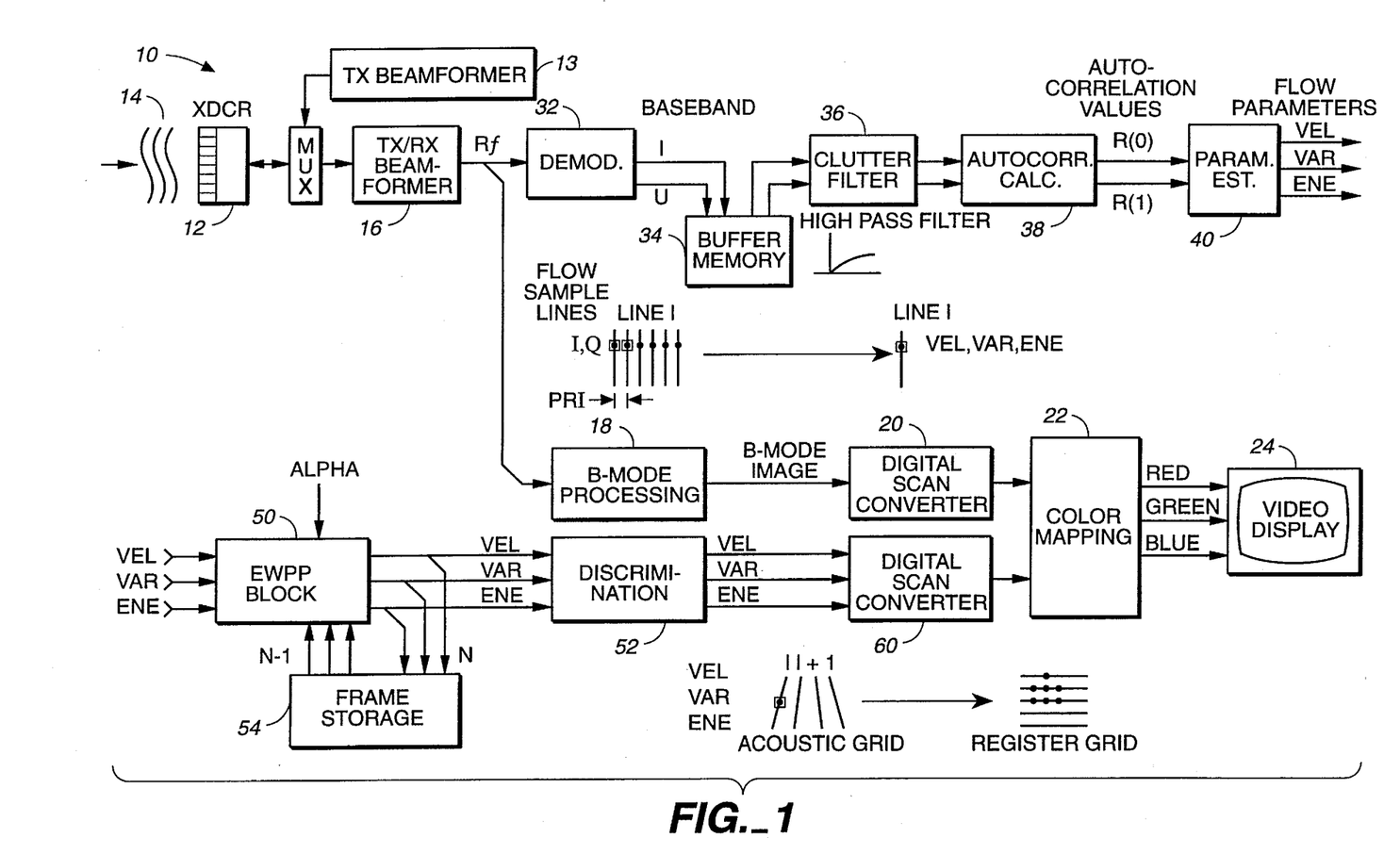
FIG. 1 is a block diagram of an ultrasound imaging system illustrating the invention.

FIG. 1 is a block diagram of an ultrasound imaging system 10 for illustrating the invention. As shown in FIG. 1, ultrasound imaging system 10 includes a transmit beamformer 13 applying appropriate signals to a transducer 12 for transmitting ultrasound signals towards an environment including moving objects (not shown), such as moving tissue or blood flow in a blood vessel in a human or animal body. The ultrasound signals are transmitted sequentially along scan lines (not shown) spanning an area of interest. The echoes of such ultrasound signals 14 reflected off of the environment as well as the moving objects are detected by transducer 12 whose output is applied to a receive beamformer 16. The output of receive beamformer 16 is processed by a B-mode processing unit 18 to provide a grey-scale B-mode image. Such image is scanned by a scan converter 20 which translates or converts the B-mode image collected along the multiple ultrasound scan lines to a video raster format required for conventional video displays. The raster signal output from converter 20 is then converted by color mapping 22 into grey-scale pixel values for display on the video display 24.

In a parallel path, the output of receive beamformer 16 is demodulated by a demodulator 32 into in phase (I) and quadrature (Q) components that are stored in multi-line buffer memory 34. The multi-line data from memory 34 are filtered by a clutter filter 36, which is a high pass filter which filters out signals at frequencies indicative of ultrasound echoes from stationary as well as slow-moving objects. The output of filter 36 is then applied to an autocorrelator 38 which computes all the correlation values R(0) and R(1) associated with each pixel. See "Real-time Two-dimensional Blood Flow Imaging Using an Autocorrelation Technique,"

by Chihiro Kasai et al., *IEEE Transactions on Sonics and Ultrasonics*, Vol. SU-32, No. 3, pages 458–464, May 1985, for a conventional design of the autocorrelator 38. Flow parameters including mean velocity, variance of velocity of the moving objects as well as energies of the Doppler reflection of the moving objects are then estimated from the autocorrelation values by estimator 40. While in the embodiment of FIG. 1, an autocorrelator is used to derive autocorrelation values from which the flow parameters are derived, it will be understood that in lieu of the autocorrelation technique for estimation, other types of techniques of estimation may be used instead, such as those based on Fourier transform techniques. All such variations are within the scope of the invention. If functions other than autocorrelation functions are employed in block 38, a separate estimator may not be necessary and may be omitted in FIG. 1.

The flow parameters (or other parameters such as those related to tissue motion) provided as the output of estimator 40 are then filtered by an energy weighted parameter persistence block 50 for filtering the flow parameters to provide filtered values of the velocity, variance of velocity of the moving objects, and energy of the Doppler signal to discriminator 52. Since the filtering or averaging process performed by block 50 requires values of prior frames, a frame storage 54 is utilized in the filtering or averaging process. Thus, after or as flow or other parameters are obtained for an area of interest in the scan plane, such parameters are stored as a frame in storage 54. Discriminator 52 then compares the filtered values of the mean velocity, variance of velocity of the objects, and energy of the Doppler signal to certain predetermined thresholds in order to reject low energy signals caused by noise as well as low velocity signals caused by echoes from stationary or slow-moving objects. The mean velocity, variance of velocity, and energy set by discriminator 52 are then supplied to scan converter 60 which converts the multi-line data in an acoustic grid into a rectangular raster grid. Such raster data are then supplied to color mapping 22 where typically the output of converter 60 is represented in color while the output of converter 20 is represented in grey-scale, where the color encoded output of converter 60 forms a two-dimensional color image superimposed on the grey-scale B-mode image output of converter 20 in order to show, for example, blood flow direction and velocity within a blood vessel against a grey-scale background on video display 24.

Figure 2:
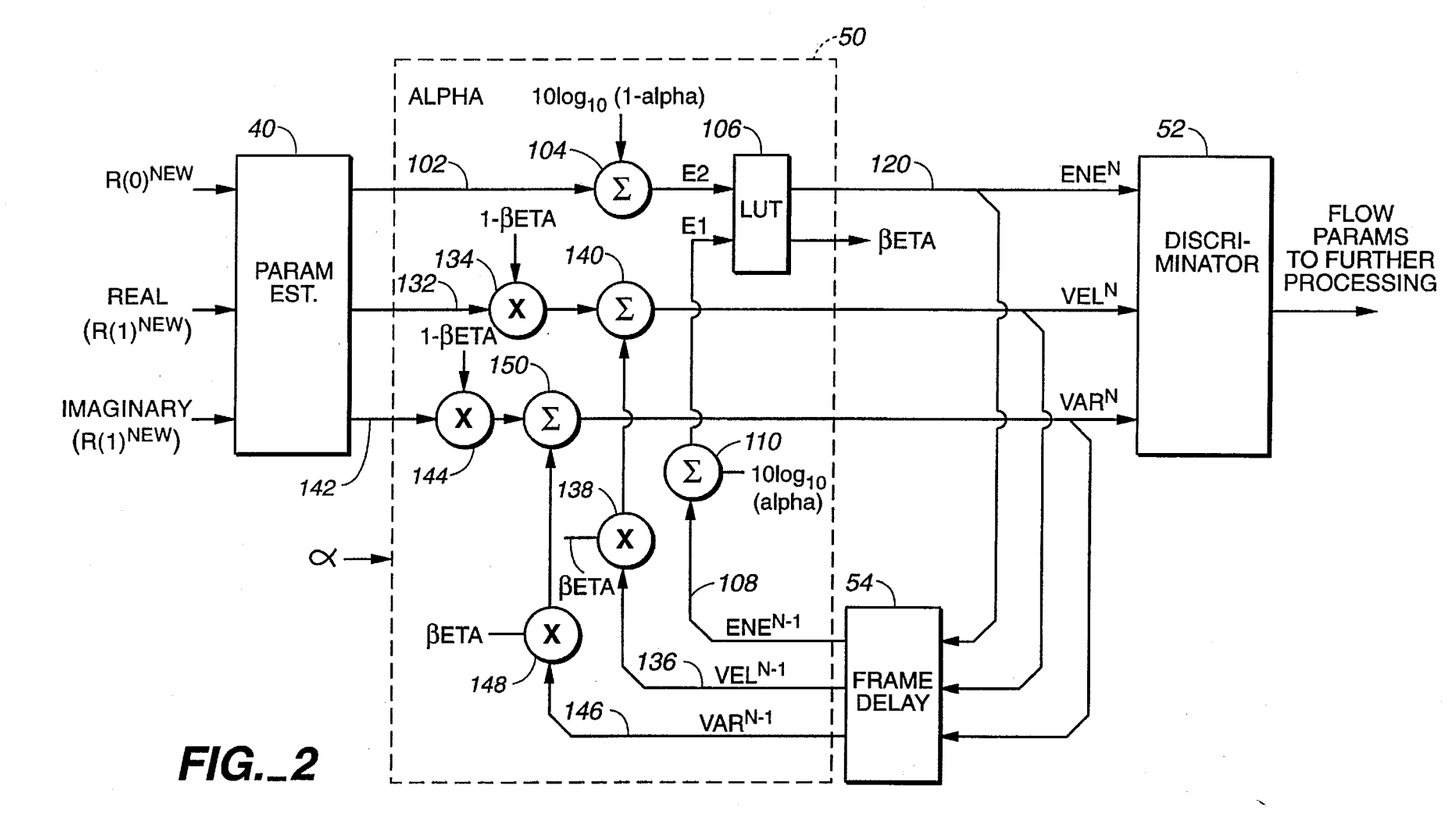
FIG. 2 is a block diagram of a portion of the system of FIG. 1 showing in more detail the energy weighted parameter persistence block of FIG. 1 and frame storage arranged in an infinite impulse response (IIR) temporal filter structure arrangement to illustrate the preferred embodiment of the invention.

The preferred embodiment will now be described in reference to FIG. 2. For convenience, the moving object to be imaged is described as blood flow so that the parameters estimated will be referred to as flow parameters, with the understanding that the description below is applicable to other moving objects as well. FIG. 2 is a block diagram showing in more detail a composition of block 50 and its connection to blocks 40, 52 and 54. In the embodiment of FIGS. 1 and 2, block 50 computes the temporally filtered flow parameters based on the set of currently estimated parameters and the set of previously filtered parameters. In such event, frame storage 54 will store the set of previously filtered flow parameters and supply such parameters to block 50 for computing an updated set of flow parameters for the current frame. After block 50 derives the set of filtered or averaged flow parameters, such set is then stored in frame storage 54 (in a feedback arrangement for IIR, as explained below) to replace the previous frame parameters and such set for the current frame is then again supplied to block 50 for computing the filtered or averaged flow parameters for the next frame. This process is then repeated for all the frames.

As shown in FIG. 2, frame storage 54 may simply be implemented by means of a frame delay. In reference to FIG. 2, estimator 40 estimates the mean velocity, variance of velocity, and energy of the Doppler signal for the Nth frame from autocorrelation functions, R(0) and the real and imaginary components of R(1). The mean flow velocity, the energy of the Doppler signal from the flow as well as the variance of the flow velocity may be derived in a manner known to those skilled in the art from the autocorrelation values. See "Real-time Two-dimensional Blood Flow Imaging Using an Autocorrelation Technique," by Chihiro Kasai et al., *IEEE Transactions on Sonics and Ultrasonics*, Vol. SU-32, No. 3, pages 458–464, May 1985. See also "Doppler Ultrasound-physics, Instrumentation, and Clinical Applications," by D. H. Evans et al., John Wiley & Sons, New York, page 102–105, 1989.

In the preferred embodiment, estimator 40 may simply be a lookup table. Also in the preferred embodiment, it is preferable for estimator 40 to provide an energy parameter proportional to the logarithm of the energy of the Doppler signal rather than the energy itself because of the wide dynamic range of the energy. Thus, in the preferred embodiment, estimator 40 would provide an energy-related parameter which is $10*\log_{10} \text{energy}^N$ for the Nth frame. Such signal is provided on line 102 to adder 104 which adds to it the quantity $10*\log_{10}(1-\text{alpha})$. Since block 50 operates on the logarithm of the energy, the effect of the addition is to multiply the estimated energy parameter by the factor (1-alpha) to obtain E2. Adder 104 provides an output E2 to a lookup table 106. Frame delay 54 provides the filtered or averaged energy for the (N–1)th frame to adder 110 which adds to it $10*\log_{10}\text{alpha}$. Again, since block 50 operates on the logarithm of the energy of the (N–1)th frame, the addition has the effect of multiplying the averaged energy of the (N–1)th frame by the factor alpha. The output E1 of adder 110 is then provided to lookup table 106 which provides the sum of the two quantities E1 and E2 to provide a weighted average of the parameters related to the energies of the Doppler signals from said flow at the same pixel location in the N and the (N–1)th frames. The averaged energy parameter is then provided on line 112 to be displayed as the energy of the nth frame. Such output is applied to discriminator 52 which compares such quantity to a predetermined threshold. This is done for all pixel locations in the frame coinciding with the area of interest.

In the above description, alpha is the scale factor for selecting relative weighting between the Nth frame and the (N–1)th frame. Thus, in the operation above of block 50, the lookup table 106 performs the computation in equation 1 below:

$$\text{LOG}_{13}\text{ENERGY} = 10\log_{10}[10^{E1/10} + 10^{E2/10}] \qquad (1)$$

Of course, if one were to operate on the energy itself rather than its logarithm, one can simply implement the following equation in block 50:

$$\text{ENERGY}^N = \text{alpha}*\text{ENERGY}^{N-1} + (1-\text{alpha})*\text{ENERGY}^{NEW} \qquad (2)$$

To implement equation 2, adders 104, 110 will simply be replaced by multipliers 104', 110' where multiplier 104' will simply multiply the signal on line 102 by (1-alpha) and multiplier 110' will multiply the signal from frame delay 54 by alpha and the lookup table 106 will simply add the two inputs to provide its output on line 120.

Discriminator 52 compares the output of lookup table 106 on line 120 to a predetermined threshold in order to discriminate against noise. If the signal on line 120 exceeds the threshold, discriminator 52 would provide the signal on line 120 as an output. If the signal amplitude on line 120 falls below the threshold, discriminator 52 simply sets the mean velocity, variance of velocity, and energy of the frame to values whereby such values would not be displayed, since in this instance, the velocity and variance of velocity as well as the energy may simply reflect noise signals rather than the flow of the body fluid such as blood. Therefore, discriminator 52 sets the values for the mean velocity and variance of velocity of the Nth frame as a function of the weighted average of the energy parameters for the Nth and (N−1)th frames.

As shown in FIG. 2, block 50 preferably also derives a weighted average of velocity and variance of velocity between the Nth and (N−1)th frames using the scale factor beta. Specifically, estimator 40 provides an estimated mean velocity value for the new frame from the new autocorrelation values on line 132.and provides such signal to multiplier 134. The filtered or averaged mean velocity for the (N−1)th frame is provided by frame delay 54 on line 136 to multiplier 138 which multiplies such signal by a scale factor beta. Multiplier 134 multiplies the estimated new mean velocity on line 132 by the factor (1-beta). The outputs of multipliers 134 and 138 are then added by adder 140 and provided as the filtered or averaged mean velocity for the Nth frame to discriminator 52. Multipliers 144, 148 and adder 150 are used to compute a similar weighted average of the variance from the estimated variance from the new frame from estimator 40 and the filtered or averaged variance from the (N−1)th frame provided by frame delay 54. Such averaged or filtered variance is then provided at the output of adder 150 to discriminator 52.

In the preferred embodiment, the scale factor beta is a function of the energy parameters of the Nth and (N−1)th frames. Preferably, beta may be obtained in accordance with the following equations (3)–(5):

$$E1 = 10\log_{10}\text{alpha} + 10\log_{10}\text{ENERGY}^{N-1} \quad (3)$$

$$E2 = 10\log_{10}(1-\text{alpha}) + 10\log_{10}\text{ENERGY}^{NEW} \quad (4)$$

$$\text{beta} = \frac{10^{E1/10}}{10^{E1/10} + 10^{E2/10}} \quad (5)$$

where $\text{ENERGY}^{NEW}$ is the estimated energy parameter from estimator 40 based on the autocorrelation values for the Nth or the new frame, and $\text{ENERGY}^{N-1}$ is the filtered energy parameter for the previous frame at the same pixel location provided by frame delay 54. The operations of multipliers 134, 138 and adder 140 as well as that of multipliers 144, 148 and adder 150 can be represented in equation form in equations (6) and (7) below:

$$\text{VELOCITY}^N = \text{beta}*\text{VELOCITY}^{N-1} + (1-\text{beta})*\text{VELOCITY}^{NEW} \quad (6)$$

$$\text{VARIANCE}^N = \text{beta}*\text{VARIANCE}^{N-1} + (1-\text{beta})*\text{VARIANCE}^{NEW} \quad (7)$$

where $\text{VELOCITY}^{NEW}$, $\text{VARIANCE}^{NEW}$ are the estimated mean velocity and variance parameters by estimator 40 based on autocorrelation values for the Nth frame, and $\text{VELOCITY}^{N-1}$, $\text{VARIANCE}^{N-1}$ are the filtered values provided by frame storage 54. If the scale factor beta is not related to the energy of energy estimates, unreliable parameter estimates with poor SNR are treated the same as parameters acquired with good SNR. This could cause a sample with poor SNR combined with a sample with good SNR to corrupt the resultant filtered result. For this reason, it is preferable to take into account the energy of the signal when filtering the velocity and variance. The energy in the scale factor beta is then a measure of the SNR and one's confidence in the correctness of the velocity and variance estimate.

The output of discriminator 52 are the three flow parameters related to energy, mean velocity and variance of velocity which are in turn processed by converter 60 and color mapping 22 and then displayed by video display 24. The filtered or averaged values of the energy, mean velocity and variance of velocity are then applied to frame delay 54, so that after a frame delay when another set of new parameters are provided by estimator 40 from a new set of autocorrelation values for the same pixel location in the (N+1)th frame, the filtered or averaged flow parameter values for the Nth frame would then be provided by frame delay 54 to block 50 in order to filter the (N+1)th frame signals at such pixel location.

Figure 3:
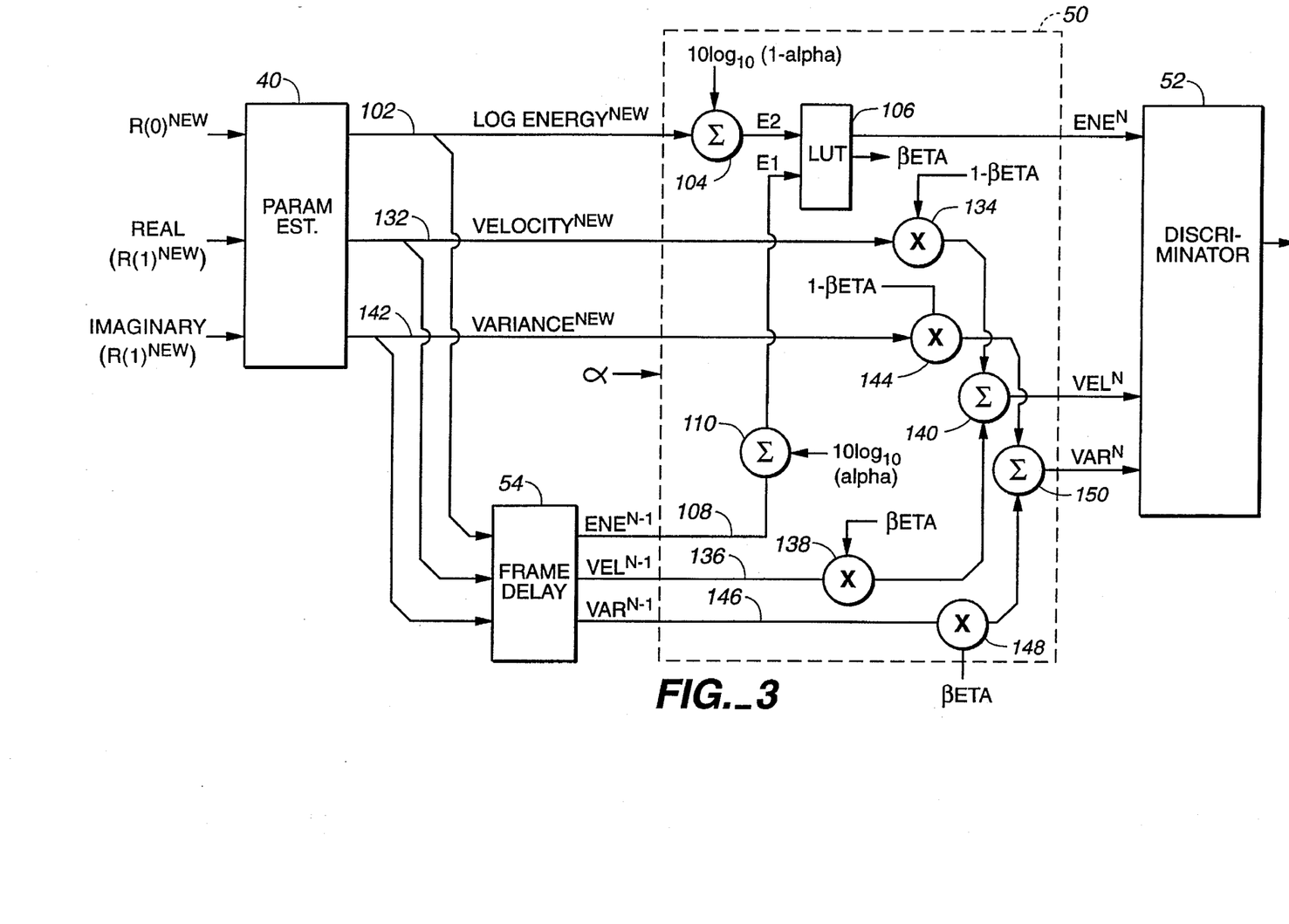
FIG. 3 is a block diagram of the energy weighted parameter persistence and frame storage blocks of FIG. 1 arranged in a finite impulse response (FIR) temporal filter structure configuration to illustrate an alternative embodiment of the invention.

In FIG. 2, the output of block 50 is fed back to block 50 through frame delay 54, forming an infinite impulse response temporal filter structure configuration. Alternatively, a finite impulse response temporal filter structure configuration may be used instead, as is illustrated in FIG. 3. As shown in FIG. 3, the inputs of frame delay 54 are connected to the output of parameter estimator 40 instead of the output of block 50 and input of discriminator 52 as in FIG. 2. Thus, instead of a feedback arrangement where the filtered or averaged flow parameter values are fed back to block 50, the unfiltered or unaveraged flow parameter values are fed from estimator 40 through frame delay 54 to block 50. Thus, when estimator 40 provides the estimated parameters for energy, mean velocity and variance for the Nth frame on lines 102, 132 and 142, frame delay 54 would provide at its output the estimated but unfiltered parameter values related to energy, mean velocity and variance for the (N−1)th frame to block 50 for performing the filtering or averaging process. The block 50 and frame delay 54 themselves, however, are identical with those in FIG. 2. Where alpha is set to 0.5 in FIG. 3, block 50 takes the simple unweighted average of the energy parameters, and sets the values for the mean velocity and variance of velocity of the Nth frame as a function of the unweighted average of the energy parameters for the Nth and (N−1)th frames.

In the configurations of FIGS. 2 and 3, the filtering or averaging process is performed using the estimated parameter values for the current frame N and one previous frame N−1. It will be obvious that the two figures need to be modified only slightly to accommodate a process for performing the filtering or averaging process employing more than one previous frame and the current frame. Thus, to accommodate the filtering process using two previous frames N−1 and N−2, an additional frame delay would then be employed in a second feedback or feed forward path to delay the filtered (feedback configuration for IIR) or the unfiltered estimated parameters (feed forward configuration for FIR) for the (N−2)th frame by two frame cycles. The outputs of the additional frame delay would then be connected to lookup table 106, adder 140 and adder 150 through respectively an additional adder and two additional multipliers. In the same vein, the scheme can be extended so that the filtering process can be based on more than two previous frames and the current frame of information. Such and other modifications are all within the scope of the invention.

The feedforward and feedback schemes may actually be combined, such as by including more feedforward or feedback paths in block 50 as indicated above and by connecting the outputs of block 50 in FIG. 3 not to a discriminator but to corresponding inputs of block 50 in FIG. 2, and the inputs of block 50 in FIG. 2 are so connected instead of to estimator 40. Thus a general scheme for an IIR filter including a plurality of feedforward and feedback paths may be represented by the relations described below.

A kth set of filtered parameter values, including $ENE_k$ related to energy, may be obtained for each pixel location in the kth frame, k being a positive integer, where ENEk is given by $$ENE_k = \sum_{n=0}^{L} a_n ENE_{k-n}^{NEW} + \sum_{n=1}^{N} \hat{a}_n ENE_{k-n}$$

where $ENE_{k-n}^{NEW}$ is the parameter estimated by the estimator 40 from the (k–n)th set of signal values corresponding to the (k–n)th input signal and (k–n)th frame, n being a non-negative integer smaller than k, $ENE_{k-n}$ being the filtered or average of parameters related to the energies of the Doppler signals derived by the persistence block for the (k–n)th input signal and (k–n)th frame; $a_n$, $\hat{a}_n$, L, N being predetermined constants, and L, N being positive integers.

The energy weighted averages $VEL_k$, $VAR_k$ of parameters related respectively to mean velocity and to variance of velocity for the kth set of flow parameter values according to the following relations:

$$VEL_k = \sum_{n=0}^{L} \beta_{k,n} VEL_{k-n}^{NEW} + \sum_{n=1}^{N} \hat{\beta}_{k,n} VEL_{k-n}$$

$$VAR_k = \sum_{n=0}^{L} \beta_{k,n} VAR_{k-n}^{NEW} + \sum_{n=1}^{N} \hat{\beta}_{k,n} VAR_{k-n}$$

where $VEL_{k-n}^{NEW}$ is the parameter related to mean velocity estimated from the (k–n)th input signal by the estimator, $VAR_{k-n}^{NEW}$ is the parameter related to variance of velocity estimated from the (k–n)th input signal by the estimator, $VEL_{k-n}$ is the averaged parameter related to mean velocity derived for the (k–n)th input signal by the device, $VAR_{k-n}$ is the averaged parameter related to variance of velocity derived for the (k–n)th input signal by the device, and $\beta_{k,n}$, $\hat{\beta}_{k,n}$ are given by:

$$\beta_{k,n} = a_n \frac{ENE_{k-n}^{New}}{ENE_k}$$

$$\hat{\beta}_{k,n} = \hat{a}_n \frac{ENE_{k-n}}{ENE_k}$$

Where L has the value 0 and N has the value 1 in the above equations, the result is the circuit in FIG. 2. Where L has the value 1 and the summations from 1 to N are not performed in the above equations, the result is the circuit in FIG. 3.

Described above are the features of an energy weighted parameter persistence for use in temporal filtering. Essentially the same scheme may be used for a spatial filter. Thus, similar to temporal filtering, where spatial resolution is not as critical, it is possible to trade spatial resolution for more "accurate" flow presentation. In spatial filtering, the flow data at one pixel location is averaged with those at surrounding pixel locations to improve SNR, based on the assumption that the flow data at a number of adjacent pixel locations are in phase so that they add in the averaging process whereas the noise would be random over these same pixels so that they cancel out in the process. It is possible to increase the speed of filtering by employing a modified circuit based on FIG. 3, by omitting the frame delay 54 in FIG. 3 and obtaining the estimated flow parameter values related to energy, mean velocity and variance. Where the input Doppler signals are supplied sequentially, the circuits of FIGS. 2, 3 may be readily adopted for spatial filtering such signals, where the only difference from temporal filtering is that averaging is performed for the estimated flow parameter values for different pixel locations in the same (or different) frames instead of for the input Doppler signals the estimated flow parameter values for the same pixel location in different frames.

Each of the input Doppler signals to the above referenced circuits for spatial filtering represents information as a set of signal values at a corresponding pixel location of a plurality of pixel locations in a frame. The estimator estimates from each set of signal values at each pixel location a corresponding set of three parameters related respectively to mean velocity, variance of velocity and energy of the corresponding input signal. Using either a feedforward or a feedback scheme, or a combination thereof, an average $ENE_{x,y}$ of parameters related to energy of input signals for a pixel location (x,y) is derived as a weighted average of the estimated or averaged parameters from a plurality of sets of signal values at the corresponding plurality of pixel locations in a selected domain in said frame, said domain including the pixel location (x,y). The domain includes the pixel locations over which the flow parameters are to be averaged to arrive at the averaged value $ENE_{x,y}$ for the pixel location (x,y) where the filtering process may be represented generally according to:

$$ENE_{x,y} = \sum_{n=-\left(\frac{N-1}{2}\right)}^{\frac{N-1}{2}} \sum_{m=-\left(\frac{M-1}{2}\right)}^{\frac{M-1}{2}} a_{m,n} ENE_{x-m,y-n}^{NEW}$$

where N, M are positive odd integers, or where N, M are positive even integers, then according to one of the following two relations:

$$ENE_{x,y} = \sum_{n=-\frac{N}{2}}^{\frac{N-2}{2}} \sum_{m=-\frac{M}{2}}^{\frac{M-2}{2}} a_{m,n} ENE_{x-m,y-n}^{NEW}$$

$$ENE_{x,y} = \sum_{n=-\frac{(N-2)}{2}}^{\frac{N}{2}} \sum_{m=-\frac{(M-2)}{2}}^{\frac{M}{2}} a_{m,n} ENE_{x-m,y-n}^{NEW}$$

wherein n, m are integers defining the domain, $a_{m,n}$ is a constant and $ENE_{x-m,y-n}^{NEW}$ the estimated parameter related to energy of the input signal corresponding to the (x–m,y–n) pixel location.

The averages $VEL_{x,y}$, $VAR_{x,y}$ of parameters related to the mean velocity of moving objects, variance of velocity of the objects for pixel location (x,y) may be derived according to the following:

$$VEL_{x,y} = \sum_{m}\sum_{n} \beta_{x,y,m,n} VEL_{x-m,y-n}^{NEW}$$

$$VAR_{x,y} = \sum_{m}\sum_{n} \beta_{x,y,m,n} VAR_{x-m,y-n}^{NEW}$$

$$\beta_{x,y,m,n} = a_{m,n} \frac{ENE_{x-m,y-n}^{NEW}}{ENE_{x,y}}$$

where $VEL_{x-m,y-n}^{NEW}$, $VAR_{x-m,y-n}^{NEW}$ are the estimated parameter related respectively to the mean velocity and variance of velocity of moving objects for pixel location (x–m,y–n). Preferably, N, M are equal to 3.

Figure 4:
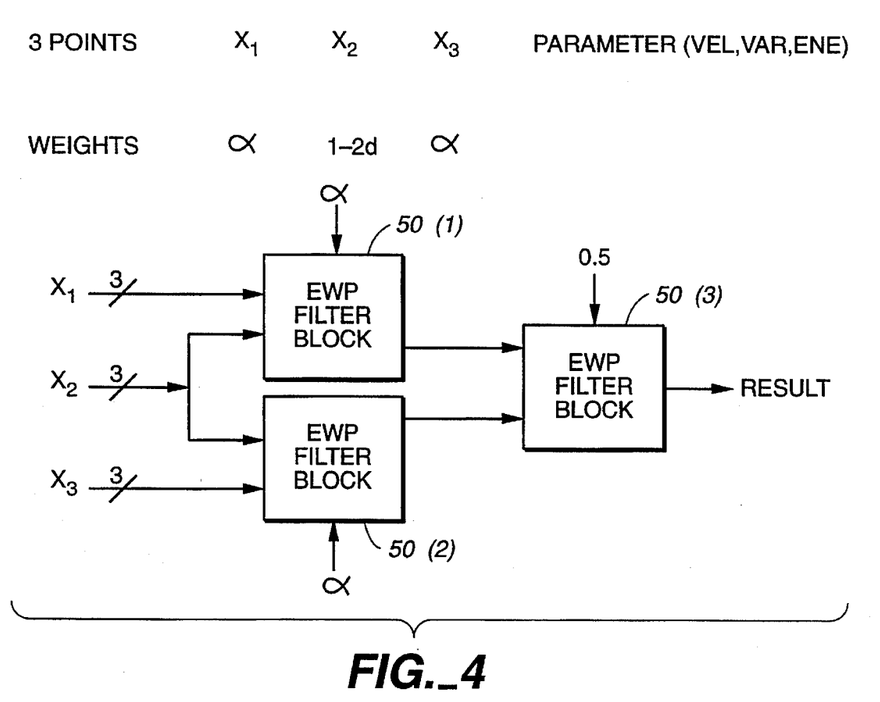
FIG. 4 is a block diagram of a three-tap spatial filter to illustrate another aspect of the invention.

In case of the spatial filter, as a special case of the equations above, it is also possible to perform the spatial filtering based on three samples rather than two, as shown in the three-tap spatial filter of FIG. 4. As shown in FIG. 4, three different parameter estimators (not shown) provide three sets of estimated flow parameters $X_1$, $X_2$ and $X_3$ from the autocorrelation values of three adjacent frames to be spatially averaged. The estimated parameters $X_1$, $X_2$ are applied to a first energy weighted parameter persistence block 50(1) which may be identical in structure to block 50 of FIGS. 1–3. Thus, the values for $X_1$ may be applied to block 50(1) through input lines equivalent to lines 102, 132, 142 of FIG. 3 whereas the values of $X_2$ may be applied through lines equivalent to lines 108, 136 and 146 of FIG. 3. In a similar manner, the estimated parameter values for $X_2$, $X_3$ may be applied to energy weighted parameter persistence block 50(2) which is identical in structure to block 50 of FIG. 3 in the same manner. Then the outputs of block 50(1), 50(2) are then applied to the input of energy weighted parameter persistence block 50(3) which is identical in structure to block 50 of FIG. 3 in the same manner. Thus, the output of block 50(3) will reflect the following weights as weighting factors for the three frames with estimated parameters $X_1$, $X_2$ and $X_3$, respectively: alpha, (1–2alpha) and alpha. Where the blocks 50(1)–50(3) operate on the logarithms of the energy-related parameter, equations employing the weighting factors similar to those shown above in equations 1 and 3–7 may be derived in a manner known to those skilled in the art.

While the invention has been described above by reference to discrete hardware components, it will be understood that block 50 and frame storage 54 may be implemented using programmable logic hardware or a microprocessor and software for implementing the equations 1–7. All such modifications and variations are within the scope of the invention. In these different embodiments, a method is employed for filtering two or more Doppler signals such as autocorrelation signals, each signal containing information on mean velocity and variance of velocity of moving objects and energy of a Doppler signal from said objects. While the above schemes describe only temporal filtering or spatial filtering, a scheme for both temporal and spatial filtering can be easily achieved, where the flow parameter values at a current first pixel location of a frame are averaged with flow parameter values at a different pixel location of a prior or subsequent frame to arrive at the filtered values for the first pixel location. The method includes estimating from each of the input signals a corresponding set of parameters related to mean velocity and variance of velocity of moving objects and energy of the input signal; and deriving a preferably weighted average of the flow parameter values at a current first pixel location of a frame with flow parameter values at a different pixel location of a prior or subsequent frame. The method also sets values for an average velocity and an average variance of velocity of the moving objects as functions of the weighted average of parameters related to the energies of the Doppler signals from said moving objects at said two or more sampling times or locations. In the preferred embodiments, the method also includes the step of displaying the values set for the average velocity and the average variance of velocity of the moving objects and the weighted average of parameters related to the energies of the Doppler signals from said moving objects at said two or more sampling times or locations.

In the preferred embodiment of the invention described above, the estimator 40 estimates parameters related to mean velocity, variance of velocity and energy from the Doppler signals, and block 50 derives weighted averages of the estimated parameters related to energy, mean velocity and variance of velocity. This is not required, however, and it may be adequate in some applications to estimate the mean velocity or variance of velocity, or both if desirable, and derive a weighted average of the estimated parameters related to mean velocity or variance of velocity, or both if desirable, as functions of the energies of the signals (for example, as functions of the autocorrelation values or other energy related values). All such variations are within the scope of the invention.

The invention has been described up to this point by operations of the persistence function on Doppler information signals containing Doppler information. Essentially the same advantages can be obtained even if a somewhat different scheme is employed to derive the mean velocity, variance of velocity, and energy using time shift information instead of Doppler information. U.S. Pat. No. 4,928,698 describes a system employing time shift information for deriving the velocity and energy related to blood flows and motion of organs. The circuits and generalized schemes described above may be used to perform temporal and/or spatial filtering based on time shift information in a system such as that described in U.S. Pat. No. 4,928,698 and the article "Time Domain Formulation of Pulse Doppler Ultrasound and Blood Velocity Estimation by Cross-Correlation," by Bonnefous et al., *Ultrasonic Imaging*, 8, 73–85 (1986).

While the invention has been described above by reference to various embodiments, it will be understood that modifications and changes may be made without departing from the scope of the invention which is to be defined only by the appended claims.

What is claimed is:

1. An apparatus for filtering a plurality of Doppler or time shift signals, each Doppler or time shift signal containing information on mean velocity, variance of velocity and on energy of such Doppler or time shift signal; said apparatus comprising:

an estimator estimating from each of said Doppler or time shift signals parameters related to mean velocity and/or variance of velocity of said Doppler or time shift signal; and a device deriving a weighted average of the mean velocity related parameters and/or a weighted average of the variance of velocity related parameters by means of a weight or weights that are functions of the energies of the Doppler or time shift signals.

2. The apparatus of claim 1, said estimator comprising means for estimating from each of said Doppler or time shift signals a parameter related to energy of said Doppler or time shift signal, said device setting weighted averages of the mean velocity related and the variance of velocity related parameters as functions of a weighted average of energy related parameters of the Doppler or time shift signals by means of said weight or weights.

3. The apparatus of claim 2, further comprising a discriminator comprising means for discriminating the weighted averages of the energy, mean velocity and variance of velocity related parameters in reference to predetermined thresholds.

4. The apparatus of claim 2, wherein said estimator estimates and said device operates on the logarithms of the energy values of the Doppler or time shift signals, and said device derives the weighted average of the logarithms of the energy values of the Doppler or time shift signals.

5. The apparatus of claim 2, wherein each of said Doppler or time shift signals represents information as a set of signal values at a particular pixel location in a frame in a time sequence of frames of the same size, said estimator estimating, from each set of signal values a corresponding set of three parameters related respectively to mean velocity, variance of velocity and energy of the corresponding Doppler or time shift signal, said device deriving averages of parameters related to the mean velocity, variance of velocity and energy of Doppler or time shift signals from said sets of signal values for said pixel location, where a kth Doppler or time shift signal in the sequence corresponds to a kth set of signal values and a kth frame, k being a positive integer, said device deriving for the kth Doppler or time shift signal and kth frame an average $ENE_k$ of the parameter related to the energies of the Doppler or time shift signals, said average being given by $$ENE_k = \sum_{n=0}^{L} a_n \, ENE_{k-n}^{NEW} + \sum_{n=1}^{N} \hat{a}_n \, ENE_{k-n}$$

where $ENE_{k-n}^{NEW}$ is the parameter estimated by the estimator from the (k–n)th set of signal values corresponding to the (k–n)th Doppler or time shift signal and (K–n)th frame, n being a non-negative integer smaller than k, $ENE_{k-n}$ being the average of parameters related to the energies of the Doppler or time shift signals derived by the device for the (k–n)th Doppler or time shift signal and (k–n)th frame;

$a_n$, $\hat{a}_n$, L, N being predetermined constants, and

L, N being positive integers.

6. The apparatus of claim 5, wherein the device derives the energy weighted averages $VEL_k$, $VAR_k$ of parameters related respectively to mean velocity and to variance of velocity for the kth Doppler or time shift signal and frame according to the following relations:

$$VEL_k = \sum_{n=0}^{L} \beta_{k,n} \, VEL_{k-n}^{NEW} + \sum_{n=1}^{N} \hat{\beta}_{k,n} \, VEL_{k-n}$$

$$VAR_k = \sum_{n=0}^{L} \beta_{k,n} \, VAR_{k-n}^{NEW} + \sum_{n=1}^{N} \hat{\beta}_{k,n} \, VAR_{k-n}$$

where $VEL_{k-n}^{NEW}$ is the parameter related to mean velocity estimated from the (k–n)th Doppler or time shift signal by the estimator, $VAR_{k-n}^{NEW}$ is the parameter related to variance of velocity estimated from the (k–n)th Doppler or time shift signal by the estimator, $VEL_{k-n}$ is the averaged parameter related to mean velocity derived for the (k–n)th Doppler or time shift signal by the device, $VAR_{k-n}$ is the averaged parameter related to variance of velocity derived for the (k–n)th Doppler or time shift signal by the device, and $\beta_{k,n}$, $\hat{\beta}_{k,n}$ are given by:

$$\beta_{k,n} = a_n \frac{ENE_{k-n}^{NEW}}{ENE_k}$$

$$\hat{\beta}_{k,n} = \hat{a}_n \frac{ENE_{k-n}}{ENE_k}$$

7. The apparatus of claim 5, wherein L has the value 0 and N has the value 1.

8. The apparatus of claim 5, wherein L has the value 1 and all $ENE_{k-n}$ terms are omitted.

9. The apparatus of claim 2, wherein each Doppler or time shift signal represents information as a set of signal values at a corresponding pixel location of a plurality of pixel locations in a frame, said estimator estimating from each set of signal values at each pixel location a corresponding set of three parameters related respectively to mean velocity, variance of velocity and energy of the corresponding Doppler or time shift signal, said device deriving an average $ENE_{x,y}$ of parameters related to energy of input signals for a pixel location (x,y), as a weighted average of the estimated parameters by the estimator from a plurality of sets of signal values at the corresponding plurality of pixel locations in a domain in said frame, said domain including the pixel location (x,y).

10. The apparatus of claim 9, said device deriving the average $ENE_{x,y}$ according to:

$$ENE_{x,y} = \sum_{n=-\left(\frac{N-1}{2}\right)}^{\frac{N-1}{2}} \sum_{m=-\left(\frac{M-1}{2}\right)}^{\frac{M-1}{2}} a_{m,n} \, ENE_{x-m,y-n}^{NEW}$$

where N, M are positive odd integers, or where N, M are positive even integers, then according to one of the following two relations:

$$ENE_{x,y} = \sum_{n=-\frac{N}{2}}^{\frac{N-2}{2}} \sum_{m=-\frac{M}{2}}^{\frac{M-2}{2}} a_{m,n} \, ENE_{x-m,y-n}^{NEW}$$

$$ENE_{x,y} = \sum_{n=-\frac{(N-2)}{2}}^{\frac{N}{2}} \sum_{m=-\frac{(M-2)}{2}}^{\frac{M}{2}} a_{m,n} \, ENE_{x-m,y-n}^{NEW}$$

wherein n, m are integers, $a_{m,n}$ are constants and $ENE_{x-m,y-n}^{NEW}$ the estimated parameter related to energy of the Doppler or time shift signal corresponding to the (x–m,y–n) pixel location.

11. The apparatus of claim 10, said device deriving averages $VEL_{x,y}$, $VAR_{x,y}$ of parameters related to the mean velocity, variance of velocity for pixel location (x,y) according to the following:

$$VEL_{x,y} = \sum_m \sum_n \beta_{x,y,m,n} \, VEL_{x-m,y-n}^{NEW}$$

$$VAR_{x,y} = \sum_m \sum_n \beta_{x,y,m,n} \, VAR_{x-m,y-n}^{NEW}$$

$$\beta_{x,y,m,n} = a_{m,n} \frac{ENE_{x-m,y-n}^{NEW}}{ENE_{x,y}}$$

where $VEL_{x-m,y-n}^{NEW}$, $VAR_{x-m,y-n}^{NEW}$ are the estimated parameter related respectively to the mean velocity and variance of velocity for pixel location (x–m,y–n).

12. The apparatus of claim 10, wherein N, M are equal to 3.

13. The apparatus of claim 2, wherein said Doppler or time shift signals represent information in the form of frames of sets of signal values at different pixel locations of the frames, each set corresponding to a pixel location of a frame, and wherein said frames are supplied to the apparatus sequentially, said frames including a current frame and at least one previous frame supplied to the apparatus before said current frame, said device deriving said average of the parameters related to the energies of the Doppler or time shift signals and energy weighted averages of parameters related to mean velocity and variance of velocity of said moving objects for a pixel location in the current frame from the set of parameters estimated from signal values for said pixel location of the current frame and from the averaged parameters from signal values for said pixel location of at least one previous frame.

14. The apparatus of claim 13, said device including a recursive filter.

15. The apparatus of claim 14, said recursive filter including:
- an adder; and
- a feedback signal path including a frame delay circuit for supplying an input value that is an averaged energy related parameter or energy weighted average of mean velocity or variance of velocity for said pixel location of a previous frame to the adder for adding to said input value a parameter related to the energy, mean velocity or variance of velocity for said pixel location of the current frame.

16. The apparatus of claim 2, wherein said Doppler or time shift signals represent information in the form of frames of sets of signal values at different pixel locations of the frames,
said device deriving said average of the parameters related to the energies of the Doppler or time shift signals and energy weighted averages of parameters related to mean velocity and variance of velocity of said moving objects for a first pixel location in a first frame from the set of parameters estimated from signal values of the first frame and from sets of parameters estimated from signal values for a plurality of second pixel locations adjacent to the first pixel location.

17. The apparatus of claim 16, said device including a non-recursive filter.

18. The apparatus of claim 17, said non-recursive filter including:
- an adder; and
- a feedforward signal path including a frame delay circuit for supplying as an input value, a parameter related to the energy, mean velocity or variance of velocity at said first pixel location, to the adder for adding to said input value parameters related to the energies, mean velocities or variances of velocity at the second pixel locations.

19. The apparatus of claim 1, wherein each of said Doppler or time shift signals represents information as a set of signal values at a particular pixel location in a frame in a time sequence of frames of the same size, wherein said device derives a temporal weighted average of the mean velocity related parameters and/or a temporal weighted average of the variance of velocity related parameters from said Doppler or time shift signals.

20. The apparatus of claim 1, wherein each Doppler or time shift signal represents information as a set of signal values at a corresponding pixel location of a plurality of pixel locations in a frame, wherein said device derives a spatial weighted average of the mean velocity related parameters and/or a spatial weighted average of the variance of velocity related parameters from said Doppler or time shift signals.

21. An apparatus for filtering and displaying a plurality of Doppler or time shift signals, each Doppler or time shift signal containing information on mean velocity, variance of velocity and on energy of such Doppler or time shift signal; said apparatus comprising:
- an estimator estimating from each of said Doppler or time shift signals parameters related to mean velocity and/or variance of velocity of said Doppler or time shift signal;
- a device deriving a weighted average of the mean velocity related parameters and/or a weighted average of the variance of velocity related parameters by means of a weight or weights that are functions of the energies of the Doppler or time shift signals; and
- a display displaying the weighted average of the parameters related to the energies of the Doppler or time shift signals.

22. The apparatus of claim 21, wherein each of said Doppler or time shift signals represents information as a set of signal values at a particular pixel location in a frame in a time sequence of frames of the same size, wherein said device derives a temporal weighted average of the mean velocity related parameters and/or a temporal weighted average of the variance of velocity related parameters from said Doppler or time shift signals.

23. The apparatus of claim 21, wherein each Doppler or time shift signal represents information as a set of signal values at a corresponding pixel location of a plurality of pixel locations in a frame, wherein said device derives a spatial weighted average of the mean velocity related parameters and/or a spatial weighted average of the variance of velocity related parameters from said Doppler or time shift signals.

24. An apparatus for filtering a plurality of Doppler or time shift signals, each Doppler or time shift signal containing information on mean velocity, variance of velocity and on energy of such Doppler or time shift signal; said apparatus comprising:
- means for estimating from each of said Doppler or time shift signals parameters related to mean velocity and/or variance of velocity of said Doppler or time shift signal; and
- means for deriving a weighted average of the mean velocity related parameters and/or a weighted average of the variance of velocity related parameters by means of a weight or weights that are functions of the energies of the Doppler or time shift signals.

25. A method for filtering a plurality of Doppler or time shift signals, each Doppler or time shift signal containing information on mean velocity, variance of velocity and on energy of such Doppler or time shift signal; said method comprising the steps of:
- estimating from each of said Doppler or time shift signals parameters related to mean velocity and/or variance of velocity of said Doppler or time shift signal; and
- deriving a weighted average of the mean velocity related parameters and/or a weighted average of the variance of velocity related parameters by means of a weight or weights that are functions of the energies of the Doppler or time shift signals.

26. The method of claim 25, wherein said estimating step estimates from each of said Doppler or time shift signals a parameter related to energy of said Doppler or time shift signal, wherein said deriving step also sets weighted averages of the mean velocity related and the variance of velocity related parameters as functions of a weighted average of energy related parameters of the Doppler or time shift signals by means of said weight or weights.

27. The method of claim 26, further comprising discriminating the weighted averages of the energy, mean velocity and variance of velocity related parameters in reference to predetermined thresholds.

28. The method of claim 26, wherein said estimating step estimates and said deriving step operates on the logarithms of the energy values of the Doppler or time shift signals, and said deriving step derives the weighted average of the logarithms of the energy values of the Doppler or time shift signals.

29. The method of claim 26, wherein each of said Doppler or time shift signals represents information as a set of signal values at a particular pixel location in a frame in a time sequence of frames of the same size, said estimating step estimating, from each set of signal values a corresponding set of three parameters related respectively to mean velocity, variance of velocity and energy of the corresponding Doppler or time shift signal, said deriving step deriving averages of parameters related to the mean velocity, variance of velocity and energy of Doppler or time shift signals from said sets of signal values for said pixel location, where a kth Doppler or time shift signal in the sequence corresponds to a kth set of signal values and a kth frame, k being a positive integer, said deriving step deriving for the kth Doppler or time shift signal and kth frame an average $ENE_k$ of the parameter related to the energies of the Doppler or time shift signals, said average being given by $$ENE_k = \sum_{n=0}^{L} a_n ENE_{k-n}^{NEW} + \sum_{n=1}^{N} \hat{a}_n ENE_{k-n}$$

where $ENE_{k-n}^{NEW}$ is the parameter estimated by the estimating step from the (k−n)th set of signal values corresponding to the (k−n)th Doppler or time shift signal and (K−n)th frame, n being a non-negative integer smaller than k, $ENE_{k-n}$ being the average of parameters related to the energies of the Doppler or time shift signals derived by the deriving step for the (k−n)th Doppler or time shift signal and (k−n)th frame;

$a_n$, $\hat{a}_n$, L, N being predetermined constants, and

L, N being positive integers.

30. The method of claim 29, wherein the deriving step derives the energy weighted averages $VEL_k$, $VAR_k$ of parameters related respectively to mean velocity and to variance of velocity for the kth Doppler or time shift signal and frame according to the following relations:

$$VEL_k = \sum_{n=0}^{L} \beta_{k,n} VEL_{k-n}^{NEW} + \sum_{n=1}^{N} \hat{\beta}_{k,n} VEL_{k-n}$$

$$VAR_k = \sum_{n=0}^{L} \beta_{k,n} VAR_{k-n}^{NEW} + \sum_{n=1}^{N} \hat{\beta}_{k,n} VAR_{k-n}$$

where $VEL_{k-n}^{NEW}$ is the parameter related to mean velocity estimated from the (k−n)th Doppler or time shift signal by the estimating step, $VAR_{k-n}^{NEW}$ is the parameter related to variance of velocity estimated from the (k−n)th Doppler or time shift signal by the estimating step, $VEL_{k-n}$ is the averaged parameter related to mean velocity derived for the (k−n)th Doppler or time shift signal by the deriving step, $VAR_{k-n}$ is the averaged parameter related to variance of velocity derived for the (k−n)th Doppler or time shift signal by the deriving step, and $\beta_{k,n}$, $\hat{\beta}_{k,n}$ are given by:

$$\beta_{k,n} = a_n \frac{ENE_{k-n}^{NEW}}{ENE_k}$$

$$\hat{\beta}_{k,n} = \hat{a}_n \frac{ENE_{k-n}}{ENE_k}$$

31. The method of claim 29, wherein L has the value 0 and N has the value 1.

32. The method of claim 29, wherein L has the value 1 and all $ENE_{k-n}$ terms are omitted.

33. The method of claim 26, wherein each Doppler or time shift signal represents information as a set of signal values at a corresponding pixel location of a plurality of pixel locations in a frame, said estimating step estimating from each set of signal values at each pixel location a corresponding set of three parameters related respectively to mean velocity, variance of velocity and energy of the corresponding Doppler or time shift signal, said deriving step deriving an average $ENE_{x,y}$ of parameters related to energy of input signals for a pixel location (x,y), as a weighted average of the estimated parameters by the estimating step from a plurality of sets of signal values at the corresponding plurality of pixel locations in a domain in said frame, said domain including the pixel location (x,y).

34. The method of claim 33, said deriving step deriving the average $ENE_{x,y}$ according to:

$$ENE_{x,y} = \sum_{n=-\left(\frac{N-1}{2}\right)}^{\frac{N-1}{2}} \sum_{m=-\left(\frac{M-1}{2}\right)}^{\frac{M-1}{2}} a_{m,n} ENE_{x-m,y-n}^{NEW}$$

where N, M are positive odd integers, or where N, M are positive even integers, then according to one of the following two relations:

$$ENE_{x,y} = \sum_{n=-\frac{N}{2}}^{\frac{N-2}{2}} \sum_{m=-\frac{M}{2}}^{\frac{M-2}{2}} a_{m,n} ENE_{x-m,y-n}^{NEW}$$

$$ENE_{x,y} = \sum_{n=-\frac{(N-2)}{2}}^{\frac{N}{2}} \sum_{m=-\frac{(M-2)}{2}}^{\frac{M}{2}} a_{m,n} ENE_{x-m,y-n}^{NEW}$$

wherein n, m are integers, $a_{m,n}$ are constants and $ENE_{x-m,y-n}^{NEW}$ the estimated parameter related to energy of the Doppler or time shift signal corresponding to the (x−m,y−n) pixel location.

35. The method of claim 34, said deriving step deriving averages $VEL_{x,y}$, $VAR_{x,y}$ of parameters related to the mean velocity, variance of velocity for pixel location (x,y) according to the following:

$$VEL_{x,y} = \sum_{m}\sum_{n} \beta_{x,y,m,n} VEL_{x-m,y-n}^{NEW}$$

$$VAR_{x,y} = \sum_{m}\sum_{n} \beta_{x,y,m,n} VAR_{x-m,y-n}^{NEW}$$

$$\beta_{x,y,m,n} = a_{m,n} \frac{ENE_{x-m,y-n}^{NEW}}{ENE_{x,y}}$$

where $VEL_{x-m,y-n}^{NEW}$, $VAR_{x-m,y-n}^{NEW}$ are the estimated parameter related respectively to the mean velocity and variance of velocity for pixel location (x−m,y−n).

36. The method of claim 34, wherein N, M are equal to 3.

37. The method of claim 26, wherein said Doppler or time shift signals represent information in the form of frames of sets of signal values at different pixel locations of the frames, each set corresponding to a pixel location of a frame, and wherein said frames are supplied to the method sequentially, said frames including a current frame and at least one previous frame supplied to the method before said current frame, said deriving step deriving said average of the parameters related to the energies of the Doppler or time shift signals and energy weighted averages of parameters related to mean velocity and variance of velocity of said moving objects for a pixel location in the current frame from the set of parameters estimated from signal values for said pixel location of the current frame and from the averaged parameters from signal values for said pixel location of at least one previous frame.

38. The method of claim 26, wherein said Doppler or time shift signals represent information in the form of frames of sets of signal values at different pixel locations of the frames, said deriving step deriving said average of the parameters related to the energies of the Doppler or time shift signals and energy weighted averages of parameters related to mean velocity and variance of velocity of said moving objects for a first pixel location in a first frame from the set of parameters estimated from signal values of the first frame and from sets of parameters estimated from signal values for a plurality of second pixel locations adjacent to the first pixel location.

39. The method of claim 25, wherein each of said Doppler or time shift signals represents information as a set of signal values at a particular pixel location in a frame in a time sequence of frames of the same size, said deriving step deriving a temporal weighted average of the mean velocity related parameters and/or a temporal weighted average of the variance of velocity related parameters from said Doppler or time shift signals.

40. The method of claim 25, wherein each Doppler or time shift signal represents information as a set of signal values at a corresponding pixel location of a plurality of pixel locations in a free, said deriving step deriving a spatial weighted average of the mean velocity related parameters and/or a spatial weighted average of the variance of velocity related parameters from said Doppler or time shift signals.

41. A method for filtering and displaying a plurality of Doppler or time shift signals, each Doppler or time shift signal containing information on mean velocity, variance of velocity and on energy of such Doppler or time shift signal; said method comprising the steps of:

estimating from each of said Doppler or time shift signals parameters related to mean velocity and/or variance of velocity of said Doppler or time shift signal;

deriving a weighted average of the mean velocity related parameters and/or a weighted average of the variance of velocity related parameters by means of a weight or weights that are functions of the energies of the Doppler or time shift signals; and displaying the weighted average of the parameters related to the energies of the Doppler or time shift signals.

42. The method of claim 41, wherein each of said Doppler or time shift signals represents information as a set of signal values at a particular pixel location in a frame in a time sequence of frames of the same size, said deriving step deriving a temporal weighted average of the mean velocity related parameters and/or a temporal weighted average of the variance of velocity related parameters from said Doppler or time shift signals.

43. The method of claim 41, wherein each Doppler or time shift signal represents information as a set of signal values at a corresponding pixel location of a plurality of pixel locations in a frame, said deriving step deriving a spatial weighted average of the mean velocity related parameters and/or a spatial weighted average of the variance of velocity related parameters from said Doppler or time shift signals.

* * * * *

UNITED STATES PATENT AND TRADEMARK OFFICE
CERTIFICATE OF CORRECTION

PATENT NO. : 5,609,155
DATED : March 11, 1997
INVENTOR(S) : Ismayil M. Guracar

It is certified that error appears in the above-indentified patent and that said Letters Patent is hereby corrected as shown below:

Column 6, at line 52 replace:
—$LOG_{13}ENERGY = 10\log_{10}[10^{E1/10} + 10^{E2/10}]$— with
"$LOG\_ENERGY = 10\log_{10}[10^{E1/10} + 10^{E2/10}]$"

Column 9, line 5 replace:
—the kth frame, k being a positive integer, where ENEk is— with
"the kth frame, k being a positive integer, where $ENE_k$ is"

Column 17, line 25 replace:
—(K-n)th frame, n being a non-negative integer smaller than— with
"(k-n)th frame, n being a non-negative integer smaller than"

UNITED STATES PATENT AND TRADEMARK OFFICE
CERTIFICATE OF CORRECTION

PATENT NO. : 5,609,155
DATED : March 11, 1997
INVENTOR(S) : Ismayil M. Guracar

It is certified that error appears in the above-indentified patent and that said Letters Patent is hereby corrected as shown below:

Column 9, line 8; Column 13, line 15 and Column 17, line 19 replace:

$$ENE_k = \sum_{n=0}^{L} a_n \, ENE_{k-n}^{NEW} + \sum_{n=1}^{N} a_n \, ENE_{k-n}$$

with $$ENE_k = \sum_{n=0}^{L} a_n \, ENE_{k-n}^{NEW} + \sum_{n=1}^{N} \hat{a}_n \, ENE_{k-n}$$

UNITED STATES PATENT AND TRADEMARK OFFICE
CERTIFICATE OF CORRECTION

PATENT NO. : 5,609,155
DATED : March 11, 1997
INVENTOR(S) : Ismayil M. Guracar

It is certified that error appears in the above-indentified patent and that said Letters Patent is hereby corrected as shown below:

Column 9, lines 23-38; Column 13, lines 32-35 and Column 17, lines 38-42 replace:

$$VEL_k = \sum_{n=0}^{L} \beta_{k,n} VEL_{k-n}^{NEW} + \sum_{n=1}^{N} \beta_{k,n} VEL_{k-n}$$

$$VAR_k = \sum_{n=0}^{L} \beta_{k,n} VAR_{k-n}^{NEW} + \sum_{n=1}^{N} \beta_{k,n} VAR_{k-n}$$

with $$VEL_k = \sum_{n=0}^{L} \beta_{k,n} VEL_{k-n}^{NEW} + \sum_{n=1}^{N} \hat{\beta}_{k,n} VEL_{k-n}$$

$$VAR_k = \sum_{n=0}^{L} \beta_{k,n} VAR_{k-n}^{NEW} + \sum_{n=1}^{N} \hat{\beta}_{k,n} VAR_{k-n}$$

UNITED STATES PATENT AND TRADEMARK OFFICE
CERTIFICATE OF CORRECTION

PATENT NO. : 5,609,155
DATED : March 11, 1997
INVENTOR(S) : Ismayil M. Guracar

It is certified that error appears in the above-indentified patent and that said Letters Patent is hereby corrected as shown below:

Column 9 line 43, Column 13, line 55 and Column 17, line 61 replace:

$$\beta_{k,n} = a_n \frac{ENE_{k-n}}{ENE_k}$$

with $$\hat{\beta}_{k,n} = \hat{a}_n \frac{ENE_{k-n}}{ENE_k}$$

Signed and Sealed this

Twenty-second Day of July, 1997

Attest:

BRUCE LEHMAN

Attesting Officer        Commissioner of Patents and Trademarks